United States Patent
Reiss et al.

(10) Patent No.: US 11,802,220 B2
(45) Date of Patent: Oct. 31, 2023

(54) SILICA-BASED SLURRY FOR SELECTIVE POLISHING OF CARBON-BASED FILMS

(71) Applicant: CMC Materials, Inc., Aurora, IL (US)

(72) Inventors: Brian Reiss, Woodridge, IL (US); Fernando Hung Low, Naperville, IL (US); Michael Morrow, New Lenox, IL (US); Helin Huang, Aurora, IL (US)

(73) Assignee: CMC Materials, Inc., Aurora, IL (US)

( * ) Notice: Subject to any disclaimer, the term of this patent is extended or adjusted under 35 U.S.C. 154(b) by 0 days.

(21) Appl. No.: 17/474,543

(22) Filed: Sep. 14, 2021

(65) Prior Publication Data

US 2022/0089908 A1    Mar. 24, 2022

Related U.S. Application Data

(60) Provisional application No. 63/080,194, filed on Sep. 18, 2020.

(51) Int. Cl.
  *C09G 1/02* (2006.01)
  *H01L 21/3105* (2006.01)
  *C09K 13/00* (2006.01)

(52) U.S. Cl.
  CPC ............ *C09G 1/02* (2013.01); *C09K 13/00* (2013.01); *H01L 21/31053* (2013.01)

(58) Field of Classification Search
  None
  See application file for complete search history.

(56) References Cited

U.S. PATENT DOCUMENTS

| | | | |
|---|---|---|---|
| 9,343,326 B2 | 5/2016 | Kim et al. | |
| 2008/0242090 A1* | 10/2008 | Yamada | H01L 21/3212 438/692 |
| 2010/0167547 A1* | 7/2010 | Kamimura | H01L 21/31053 438/693 |
| 2019/0051537 A1 | 2/2019 | Peng et al. | |
| 2019/0211227 A1* | 7/2019 | Dockery | C09K 3/1409 |
| 2019/0345363 A1* | 11/2019 | Ho | C09G 1/02 |
| 2020/0102476 A1 | 4/2020 | Gan et al. | |

FOREIGN PATENT DOCUMENTS

| | | |
|---|---|---|
| TW | 201910457 A | 3/2019 |
| TW | 201936882 A | 9/2019 |
| TW | 202007756 A | 2/2020 |

OTHER PUBLICATIONS

Search Report Roc (Taiwan) Patent Application No. 110134166 (Translation); dated Nov. 18, 2022; 8 pages.
Korean Intellectual Property Office Acting as ISA, International Search Report and Written Opinion of the International Searching Authority issued in connection with PCT/US2021/050276 dated Jan. 12, 2022.
Borst et al., Chemical-mechanical polishing of low dielectric constant polymers and organosilicate glasses: fundamental mechanisms and application to IC interconnect technology, Springer Science+Business Media, New York, 2002.

* cited by examiner

*Primary Examiner* — Roberts P Culbert

(57) ABSTRACT

The invention provides a chemical-mechanical polishing composition comprising: (a) a silica abrasive, (b) a surfactant, (c) an iron cation, (d) optionally a ligand, and (e) water, wherein the silica abrasive has a negative zeta potential in the chemical-mechanical polishing composition. The invention also provides a method of chemically-mechanically polishing a substrate, especially a substrate comprising a carbon-based film, using said composition.

9 Claims, No Drawings

SILICA-BASED SLURRY FOR SELECTIVE POLISHING OF CARBON-BASED FILMS

BACKGROUND OF THE INVENTION

In the fabrication of integrated circuits and other electronic devices, multiple layers of conducting, semiconducting, and dielectric materials are deposited onto or removed from a substrate surface. As layers of materials are sequentially deposited onto and removed from the substrate, the uppermost surface of the substrate may become non-planar and require planarization. Planarizing a surface, or "polishing" a surface, is a process where material is removed from the surface of the substrate to form a generally even, planar surface. Planarization is useful in removing undesired surface topography and surface defects, such as rough surfaces, agglomerated materials, crystal lattice damage, scratches, and contaminated layers or materials. Planarization also is useful in forming features on a substrate by removing excess deposited material used to fill the features and to provide an even surface for subsequent levels of metallization and processing.

Compositions and methods for planarizing or polishing the surface of a substrate are well known in the art. Chemical-mechanical planarization, or chemical-mechanical polishing (CMP), is a common technique used to planarize substrates. CMP utilizes a chemical composition, known as a CMP composition or more simply as a polishing composition (also referred to as a polishing slurry), for selective removal of material from the substrate. Polishing compositions typically are applied to a substrate by contacting the surface of the substrate with a polishing pad (e.g., polishing cloth or polishing disk) saturated with the polishing composition. The polishing of the substrate typically is further aided by the chemical activity of the polishing composition and/or the mechanical activity of an abrasive suspended in the polishing composition or incorporated into the polishing pad (e.g., fixed abrasive polishing pad).

As the size of integrated circuits is reduced and the number of integrated circuits on a chip increases, the components that make up the circuits must be positioned closer together in order to comply with the limited space available on a typical chip. Effective isolation between circuits is important for ensuring optimum semiconductor performance. To that end, shallow trenches are etched into the semiconductor substrate and filled with insulating material to isolate active regions of the integrated circuit. More specifically, shallow trench isolation (STI) is a process in which a silicon nitride layer or a titanium nitride layer is formed on a silicon substrate, shallow trenches are formed via etching or photolithography, and a dielectric layer is deposited to fill the trenches. Due to variation in the depth of trenches formed in this manner, it is typically necessary to deposit an excess of dielectric material on top of the substrate to ensure complete filling of all trenches. The dielectric material (e.g., carbon-based film) conforms to the underlying topography of the substrate. The excess dielectric material is typically removed by a CMP process, which additionally provides a planar surface for further processing.

A polishing composition can be characterized according to its polishing rate (i.e., removal rate) and its planarization efficiency. The polishing rate refers to the rate of removal of a material from the surface of the substrate and is usually expressed in terms of units of length (thickness) per unit of time (e.g., Angstroms (Å) per minute). Planarization efficiency relates to step height reduction versus amount of material removed from the substrate. Specifically, a polishing surface, e.g., a polishing pad, first contacts the "high points" of the surface and must remove material in order to form a planar surface. A process that results in achieving a planar surface with less removal of material is considered to be more efficient than a process requiring removal of more material to achieve planarity.

Often the rate of removal of the carbon-based film can be rate-limiting for the dielectric polishing step in STI processes, and therefore high removal rates of the carbon-based film are desired to increase device throughput. However, if the blanket removal rate is too rapid, overpolishing of oxide in exposed trenches results in trench erosion and increased device defectivity.

A need remains for compositions and methods for chemical-mechanical polishing of carbon-based films, which will provide useful removal rates while also providing improved planarization efficiency. The invention provides such polishing compositions and methods. These and other advantages of the invention, as well as additional inventive features, will be apparent from the description of the invention provided herein.

BRIEF SUMMARY OF THE INVENTION

The invention provides a chemical-mechanical polishing composition comprising, consisting essentially of, or consisting of: (a) a silica abrasive; (b) a surfactant; (c) an iron cation; (d) optionally a ligand; and (e) water, wherein the silica abrasive has a negative zeta potential in the chemical-mechanical polishing composition.

The invention further provides a method of chemically-mechanically polishing a substrate comprising: (i) providing a substrate, (ii) providing a polishing pad, (iii) providing a chemical-mechanical polishing composition comprising: (a) a silica abrasive; (b) a surfactant; (c) an iron cation; (d) optionally a ligand; and (e) water, wherein the silica abrasive has a negative zeta potential in the chemical-mechanical polishing composition, (iv) contacting the substrate with the polishing pad and the chemical-mechanical polishing composition, and (v) moving the polishing pad and the chemical-mechanical polishing composition relative to the substrate to abrade at least a portion of the substrate to polish the substrate.

DETAILED DESCRIPTION OF THE INVENTION

The invention provides a chemical-mechanical polishing composition comprising: (a) a silica abrasive; (b) a surfactant; (c) an iron cation; (d) optionally a ligand; and (e) water, wherein the silica abrasive has a negative zeta potential in the chemical-mechanical polishing composition.

The polishing composition comprises a silica abrasive. As used herein, the terms "silica abrasive," "silica abrasive particle," "silica particle," and "abrasive particle" can be used interchangeably, and can refer to any silica particle (e.g., colloidal silica particle). The silica particle (e.g., colloidal silica particle) can be modified (e.g., surface modified) or unmodified, and have a negative native zeta potential or a positive native zeta potential. As used herein, the phrase "native zeta potential" refers to the zeta potential of the silica abrasive prior to adding the silica abrasive to the polishing composition. For example, the native zeta potential can refer to the zeta potential of a silica abrasive prior to adding the silica abrasive to the polishing composition as measured in a storage solution or an aqueous solution. A skilled artisan will be able to determine whether the silica abrasive, prior to adding the silica abrasive to the polishing composition, has a negative native zeta potential or a positive native zeta potential. The charge on dispersed particles such as a silica abrasive (e.g., colloidal silica particles) is commonly referred to as the zeta potential (or the electrokinetic potential). The zeta potential of a particle refers to the electrical potential difference between the electrical charge of the ions surrounding the particle and the electrical charge of the bulk solution of the composition in which it is measured (e.g., the liquid carrier and any other components dissolved therein). The zeta potential is typically dependent on the pH of the aqueous medium. For a given polishing composition, the isoelectric point of the particles is defined as the pH at which the zeta potential is zero. As the pH is increased or decreased away from the isoelectric point, the surface charge (and hence the zeta potential) is correspondingly decreased or increased (to negative or positive zeta potential values). The native zeta potential and the zeta potential of the polishing composition may be obtained using the Model DT-1202 Acoustic and Electro-acoustic spectrometer available from Dispersion Technologies, Inc. (Bedford Hills, N.Y.). As used herein, the phrase "negative zeta potential" refers to a silica abrasive that exhibits a negative surface charge when measured in the polishing composition. As used herein, the phase "positive zeta potential" refers to a silica abrasive that exhibits a positive surface charge when measured in the polishing composition.

The silica abrasive has a negative zeta potential in the chemical-mechanical polishing composition. Without wishing to be bound by any particular theory, it is believed that the negative zeta potential of the silica abrasive the chemical-mechanical polishing composition has a favorable interaction with the cationic nature of the surface of the carbon-based films, which helps to produce the favorable polishing features described herein. In some embodiments, the silica abrasive has a zeta potential of less than 0 mV when measured in the polishing composition, i.e., the silica abrasive has a negative zeta potential when measured in the polishing composition. For example, the silica abrasive can have a zeta potential of −10 mV or less in the chemical-mechanical polishing composition, a zeta potential of −20 mV or less in the chemical-mechanical polishing composition, a zeta potential of −30 mV or less in the chemical-mechanical polishing composition, or a zeta potential of −40 mV or less in the chemical-mechanical polishing composition. In some embodiments, the silica abrasive has a negative zeta potential of from about 0 mV to about −60 mV, e.g., from about −10 mV to about −60 mV, from about −10 mV to about −50 mV, from about −10 mV to about −40 mV, from about −20 mV to about −60 mV, from about −20 mV to about −50 mV, from about −20 mV to about −40 mV, from about −30 mV to about −40 mV, or from about −20 mV to about −30 mV.

The silica abrasive (e.g., colloidal silica particle) can be modified (e.g., surface modified) or unmodified, and have a negative native zeta potential or a positive native zeta potential. Thus, the silica abrasive (e.g., colloidal silica particle) can have a positive zeta potential or a negative zeta potential prior to addition to the chemical-mechanical polishing composition. For example, the silica particle (e.g., colloidal silica particle) can have a native zeta potential of less than 0 mV (e.g., −5 mV, or lower) prior to addition to the chemical-mechanical polishing composition. Alternatively, the silica particle (e.g., colloidal silica particle) can have a native zeta potential of 0 mV or more (e.g., 5 mV, or more) prior to addition to the chemical-mechanical polishing composition. When added to the chemical-mechanical polishing composition of the invention described herein, the silica abrasive having a negative native zeta potential maintains a negative zeta potential (for example, by (i) using a cationic surfactant that is unable to convert the negative zeta potential to a positive zeta potential or (ii) using an anionic surfactant that maintains the negative zeta potential). Alternatively, when added to the chemical-mechanical polishing composition of the invention described herein, the silica abrasive having a positive native zeta potential desirably is converted to a silica abrasive having a negative zeta potential (for example, by using an anionic surfactant capable of converting the positive zeta potential to a negative zeta potential).

Silica particles (e.g., colloidal silica particles) and charged silica particles (e.g., colloidal silica particles) can be prepared by various methods, some examples of which are commercially used and known. Useful silica particles include precipitated or condensation-polymerized silica, which may be prepared using known methods, such as by methods referred to as the "sol gel" method or by silicate ion-exchange. Condensation-polymerized silica particles are often prepared by condensing $Si(OH)_4$ to form substantially spherical (e.g., spherical, ovular, or oblong) particles. The precursor $Si(OH)_4$ may be obtained, for example, by hydrolysis of high purity alkoxysilanes, or by acidification of aqueous silicate solutions. U.S. Pat. No. 5,230,833 describes a method for preparing colloidal silica particles in solution.

In some embodiments, the silica abrasive is colloidal silica. As known to one of ordinary skill in the art, colloidal silicas are suspensions of fine amorphous, nonporous and typically spherical particles in a liquid phase. The colloidal silica can take the form of condensation-polymerized or precipitated silica particles. In some embodiments, the silica is in the form of wet-process type silica particles. The particles, e.g., colloidal silica, can have any suitable average size (i.e., average particle diameter). If the average abrasive particle size is too small, the polishing composition may not exhibit sufficient removal rate. In contrast, if the average abrasive particle size is too large, the polishing composition may exhibit undesirable polishing performance such as, for example, poor substrate defectivity.

Accordingly, the silica abrasive (e.g., silica particles or colloidal silica particles) can have an average particle size of about 10 nm or more, for example, about 15 nm or more, about 20 nm or more, about 25 nm or more, about 30 nm or more, about 35 nm or more, about 40 nm or more, about 45 nm or more, or about 50 nm or more. Alternatively, or in addition, the silica abrasive can have an average particle size of about 200 nm or less, for example, about 175 nm or less, about 150 nm or less, about 125 nm or less, about 100 nm or less, about 75 nm or less, about 50 nm or less, or about 40 nm or less. Thus, the silica abrasive can have an average particle size bounded by any two of the aforementioned endpoints.

For example, the silica abrasive (e.g., silica particles or colloidal silica particles) can have an average particle size of about 10 nm to about 200 nm, about 20 nm to about 200 nm, about 20 nm to about 175 nm, about 20 nm to about 150 nm, about 25 nm to about 125 nm, about 25 nm to about 100 nm, about 30 nm to about 100 nm, about 30 nm to about 75 nm, about 30 nm to about 40 nm, or about 50 nm to about 100 nm. For non-spherical silica abrasive particles, the size of the particle is the diameter of the smallest sphere that encompasses the particle. The particle size of the abrasive can be measured using any suitable technique, for example, using laser diffraction techniques. Suitable particle size measurement instruments are available from e.g., Malvern Instruments (Malvern, UK).

The silica abrasive (e.g., silica particles or colloidal silica particles) preferably are colloidally stable in the polishing composition. The term colloid refers to the suspension of particles in the liquid carrier (e.g., water). Colloidal stability refers to the maintenance of that suspension through time. In the context of this invention, an abrasive is considered colloidally stable if, when the abrasive is placed into a 100 mL graduated cylinder and allowed to stand unagitated for a time of 2 hours, the difference between the concentration of particles in the bottom 50 mL of the graduated cylinder ([B] in terms of g/mL) and the concentration of particles in the top 50 mL of the graduated cylinder ([T] in terms of g/mL) divided by the initial concentration of particles in the abrasive composition ([C] in terms of g/mL) is less than or equal to 0.5 (i.e., $\{[B]-[T]\}/[C] \leq 0.5$). More preferably, the value of $[B]-[T]/[C]$ is less than or equal to 0.3, and most preferably is less than or equal to 0.1.

The silica abrasive can be present in the polishing composition in any suitable amount. If the polishing composition of the invention comprises too little abrasive, the composition may not exhibit sufficient removal rate. In contrast, if the polishing composition comprises too much abrasive then the polishing composition may exhibit undesirable polishing performance and/or may not be cost effective and/or may lack stability. The polishing composition can comprise about 10 wt. % or less of the silica abrasive, for example, about 9 wt. % or less, about 8 wt. % or less, about 7 wt. % or less, about 6 wt. % or less, about 5 wt. % or less, about 4 wt. % or less, about 3 wt. % or less, about 2 wt. % or less, about 1 wt. % or less, about 0.9 wt. % or less, about 0.8 wt. % or less, about 0.7 wt. % or less, about 0.6 wt. % or less, or about 0.5 wt. % or less of the silica abrasive. Alternatively, or in addition, the polishing composition can comprise about 0.001 wt. % or more of the silica abrasive, for example, about 0.005 wt. % or more, about 0.01 wt. % or more, 0.05 wt. % or more, about 0.1 wt. % or more, about 0.2 wt. % or more, about 0.3 wt. % or more, about 0.4 wt. % or more, about 0.5 wt. % or more, or about 1 wt. % or more of silica abrasive. Thus, the polishing composition can comprise silica abrasive in an amount bounded by any two of the aforementioned endpoints, as appropriate.

For example, in some embodiments, the silica abrasive can be present in the polishing composition in an amount of from about 0.001 wt. % to about 10 wt. % of the polishing composition, e.g., about 0.001 wt. % to about 8 wt. %, about 0.001 wt. % to about 6 wt. %, about 0.001 wt. % to about 5 wt. %, about 0.001 wt. % to about 4 wt. %, about 0.001 wt. % to about 2 wt. %, about 0.001 wt. % to about 1 wt. %, about 0.01 wt. % to about 10 wt. %, about 0.01 wt. % to about 8 wt. %, about 0.01 wt. % to about 6 wt. %, about 0.01 wt. % to about 5 wt. %, about 0.01 wt. % to about 4 wt. %, about 0.01 wt. % to about 2 wt. %, about 0.01 wt. % to about 1 wt. %, about 0.05 wt. % to about 10 wt. %, about 0.05 wt. % to about 8 wt. %, about 0.05 wt. % to about 6 wt. %, about 0.05 wt. % to about 5 wt. %, about 0.05 wt. % to about 4 wt. %, about 0.05 wt. % to about 2 wt. %, about 0.05 wt. % to about 1 wt. %, about 0.1 wt. % to about 10 wt. %, about 0.1 wt. % to about 8 wt. %, about 0.1 wt. % to about 6 wt. %, about 0.1 wt. % to about 5 wt. %, about 0.1 wt. % to about 4 wt. %, about 0.1 wt. % to about 2 wt. %, about 0.1 wt. % to about 1 wt. %, about 0.5 wt. % to about 10 wt. %, about 0.5 wt. % to about 8 wt. %, about 0.5 wt. % to about 5 wt. %, about 0.5 wt. % to about 4 wt. %, about 0.5 wt. % to about 2 wt. %, about 0.5 wt. % to about 1 wt. %, about 1 wt. % to about 10 wt. %, about 1 wt. % to about 8 wt. %, about 1 wt. % to about 6 wt. %, about 1 wt. % to about 5 wt. %, about 1 wt. % to about 4 wt. %, or about 1 wt. % to about 2 wt. %.

The polishing composition comprises an iron cation. The iron cation can exist as ferric iron (i.e., iron III) or ferrous iron (i.e., iron II), and can be added to the composition as any suitable iron-containing salt. For example, the iron cation can result from the addition of iron nitrates, iron sulfates, iron halides (including fluorides, chlorides, bromides, and iodides, as well as perchlorates, perbromates, and periodates), and organic iron compounds such as iron acetates, acetylacetonates, citrates, gluconates, malonates, oxalates, phthalates, succinates, and combinations thereof to the polishing composition.

The polishing composition can comprise any suitable amount of the iron cation. The polishing composition can comprise about 0.01 ppm or more of the iron cation, for example, 0.1 ppm or more, about 0.5 ppm or more, about 1 ppm or more, about 5 ppm or more, about 10 ppm or more, or about 20 ppm or more. Alternatively, or in addition, the polishing composition can comprise about 100 ppm or less of the iron cation, for example, about 80 ppm or less, about 60 ppm or less, or about 40 ppm or less. Thus, the polishing composition can comprise the iron cation in an amount bounded by any two of the aforementioned endpoints. For example, the polishing composition can comprise about 0.01 ppm to about 100 ppm of the iron cation, e.g., about 0.01 ppm to about 80 ppm, about 0.01 ppm to about 60 ppm, about 0.01 ppm to about 40 ppm, about 0.1 ppm to about 100 ppm, about 0.1 ppm to about 80 ppm, about 0.1 ppm to about 60 ppm, about 0.1 ppm to about 40 ppm, about 1 ppm to about 100 ppm, about 1 ppm to about 80 ppm, about 1 ppm to about 60 ppm, about 1 ppm to about 40 ppm, about 10 ppm to about 100 ppm, about 10 ppm to about 80 ppm, about 10 ppm to about 60 ppm, or about 10 ppm to about 40 ppm. Without wishing to be bound by any particular theory, it is believed that increasing iron concentration produces higher carbon-based film removal rates. However, it is also believed that higher iron concentration may be correlated with multiple defect issues when polishing commercially available carbon-based films.

The polishing composition comprises a surfactant. The surfactant can be a cationic surfactant or an anionic surfactant. Generally, when the silica abrasive has a negative native zeta potential, the surfactant is a cationic surfactant or an anionic surfactant, and when the silica abrasive has a positive native zeta potential, the surfactant is an anionic surfactant. As described herein, the silica abrasive has a negative zeta potential in the chemical-mechanical polishing composition (i.e., when measured in the chemical-mechanical polishing composition). Thus, any suitable combination of silica particle and surfactant can be used so long as the resulting composition has a silica abrasive with a negative zeta potential. In certain embodiments, when the silica abrasive has a negative native zeta potential, the surfactant is a cationic surfactant, and when the silica abrasive has a positive native zeta potential, the surfactant is an anionic surfactant such that the resulting composition has a silica abrasive with a negative zeta potential. In preferred embodiments, the silica abrasive has a positive native zeta potential and the surfactant is an anionic surfactant such that the silica abrasive has a negative zeta potential when measured in the chemical-mechanical polishing composition.

In some embodiments, the chemical-mechanical polishing composition comprises a silica abrasive having a negative native zeta potential and a cationic surfactant such that the silica abrasive has a negative zeta potential when measured in the chemical-mechanical polishing composition.

In some embodiments, the chemical-mechanical polishing composition comprises a silica abrasive having a negative native zeta potential and an anionic surfactant such that the silica abrasive has a negative zeta potential when measured in the chemical-mechanical polishing composition.

In some embodiments, the chemical-mechanical polishing composition comprises a silica abrasive having a positive native zeta potential and an anionic surfactant such that the silica abrasive has a negative zeta potential when measured in the chemical-mechanical polishing composition.

In certain embodiments, the chemical-mechanical polishing composition comprises a silica abrasive having a native zeta potential with an opposite charge relative to the surfactant, i.e., a silica abrasive having a positive native zeta potential and an anionic surfactant or a silica abrasive having a negative native zeta potential and a cationic surfactant.

In some embodiments, the surfactant is a cationic surfactant. The cationic surfactant can be any suitable cationic surfactant, many of which are known in the art. In some embodiments, the cationic surfactant comprises a quaternary ammonium salt. Exemplary cationic surfactants include, but are not limited to, N,N,N',N',N'-pentamethyl-N-tallow alkyl-1,3-propanediammonium dichloride, (oxydi-2,1-ethanediyl) bis(coco alkyl)dimethyl ammonium dichlorides, 3-methacrylamidopropyl-trimethyl-ammonium chloride ("MAPTAC"), 3-acrylamidopropyl-trimethyl-ammonium chloride ("APTAC"), diallyldimethylammonium chloride ("DADMAC"), 2-(acryloyloxy)-N,N,N-trimethylethanaminium chloride ("DMAEA.MCQ"), 2-(methacryloyloxy)-N,N,N-trimethylethanaminium chloride ("DMAEM.MCQ"), N,N-dimethylaminoethyl acrylate benzyl chloride ("DMAEA.BCQ"), N,N-dimethylaminoethyl methacrylate benzyl chloride ("DMAEM.BCQ"), and combinations thereof.

In some embodiments, the surfactant is an anionic surfactant. The anionic surfactant can be any suitable anionic surfactant, many of which are known in the art. In some embodiments, the anionic surfactant is selected from an alkylsufonic acid, an alkylsulfonate, an arylsulfonic acid, an arylsulfonate, an alkylarylsulfonic acid, an alkylarylsulfonate, and combinations thereof. In certain embodiments, the anionic surfactant is selected from saturated or unsaturated $C_6$-$C_{40}$ alkyl sulfonate, saturated or unsaturated $C_6$-$C_{40}$ alkyl sulfonic acid, saturated or unsaturated $C_6$-$C_{40}$ alkyl benzene sulfonate, saturated or unsaturated $C_6$-$C_{40}$ alkyl benzene sulfonic acid, and combinations thereof. Exemplary anionic surfactants include, but are not limited to, CALSOFT™ surfactants commercially available from Pilot Chemical Corporation, West Chester, OH (e.g., CALSOFT™ LPS-99—dodecylbenzene sulfonic acid) or ZETASPERSE™ surfactants commercially available from Air Products, Allentown, PA (e.g., ZETASPERSE™ Z2300—a mixture of ethoxylated $C_6$-$C_{12}$ alcohols (CAS 68439-45-2) and $C_{10}$-$C_{14}$ alkylaryl sulfonates).

In some embodiments, the cationic surfactant and/or anionic surfactant comprises an alkyl chain of about 6 carbons or more. For example, the cationic surfactant and/or anionic surfactant can comprise an alkyl chain of about 8 carbons or more, e.g., about 10 carbons or more, about 12 carbons or more, about 14 carbons or more, or about 16 carbons or more. Without wishing to be bound by any particular theory, it is believed that surfactants having an alkyl chain of about 6 carbons or more (e.g., about 12 carbons or more) provide a desirably amount of wettability (i.e., lubrication) for the chemical-mechanical polishing compositions.

The polishing composition can comprise any suitable amount of the surfactant. The polishing composition can comprise about 10 ppm or more of the surfactant, for example, about 20 ppm or more, about 50 ppm or more, about 100 ppm or more, about 200 ppm or more, about 300 ppm or more, or about 500 ppm or more. Alternatively, or in addition, the polishing composition can comprise about 10,000 ppm or less of the surfactant, for example, about 8,000 ppm or less, about 6,000 ppm or less, about 5,000 ppm or less, about 4,000 ppm or less, or about 3,000 ppm or less. Thus, the polishing composition can comprise the surfactant in an amount bounded by any two of the aforementioned endpoints. For example, the polishing composition can comprise about 10 ppm to about 10,000 ppm of the surfactant, e.g., about 10 ppm to about 8,000 ppm, about 10 ppm to about 6,000 ppm, about 10 ppm to about 5,000 ppm, about 10 ppm to about 4,000 ppm, about 10 ppm to about 3,000 ppm, about 50 ppm to about 10,000 ppm of the surfactant, about 50 ppm to about 8,000 ppm, about 50 ppm to about 6,000 ppm, about 50 ppm to about 5,000 ppm, about 50 ppm to about 4,000 ppm, about 50 ppm to about 3,000 ppm, about 10 ppm to about 10,000 ppm of the surfactant, about 100 ppm to about 8,000 ppm, about 100 ppm to about 6,000 ppm, about 100 ppm to about 5,000 ppm, about 100 ppm to about 4,000 ppm, or about 100 ppm to about 3,000 ppm.

The polishing composition optionally comprises a ligand (e.g., a ligand for the iron cation). Thus, in some embodiments, the polishing composition comprises a ligand, and in other embodiments, the composition does not contain a ligand. In preferred embodiments, the polishing composition comprises a ligand (e.g., a ligand for the iron cation). The ligand can be any suitable ligand, many of which are known in the art. In some embodiments, the ligand comprises an alkene moiety, an alkyne moiety, a diacid moiety, an alcohol moiety, or a combination thereof. For example, the ligand can be any compound (e.g., organic compound) comprising an alkene moiety; an alkyne moiety; a diacid moiety; an alcohol moiety; an alkene moiety and a diacid moiety; an alkene moiety and an alcohol moiety; an alkene moiety, a diacid moiety, and an alcohol moiety; an alkyne moiety and a diacid moiety; an alkyne moiety and an alcohol moiety; an alkyne moiety, a diacid moiety, and an alcohol moiety; or an alkene moiety, an alkyne moiety, a diacid moiety, and an alcohol moiety. In some embodiments, the ligand comprises an alkene moiety and a diacid moiety; or an alkyne moiety and an alcohol moiety. Exemplary ligands include, but are not limited to succinic acid, maleic acid, malonic acid, fumaric acid, phthalic acid, isophthalic acid, terephthalic acid, oxalic acid, tartaric acid, 3,5-dimethyl-1-hexyn-3-ol, 2,4,7,9-tetramethyl-5-decyne-4,7-diol, 2,4,7,9-tetramethyl-5-decyne-4,7-diol ethoxylate, 2,5-dimethyl-3-hexyne-2,5-diol, 3-methyl-1-pentyn-3-ol, and combinations thereof.

The polishing composition can comprise any suitable amount of the ligand, when present. When the ligand is present, the polishing composition can comprise about 10 ppm or more of the ligand, for example, about 15 ppm or more, about 20 ppm or more, about 25 ppm or more, about 30 ppm or more, about 35 ppm or more, or about 40 ppm or more. Alternatively, or in addition, the polishing composition can comprise about 1000 ppm or less of the ligand, for example, about 800 ppm or less, about 600 ppm or less, about 400 ppm or less, about 200 ppm or less, about 100 ppm or less, about 80 ppm or less, about 60 ppm or less, or about 40 ppm or less. Thus, the polishing composition can comprise the ligand in an amount bounded by any two of the aforementioned endpoints. For example, the polishing composition can comprise about 10 ppm to about 1000 ppm of the ligand, e.g., about 10 ppm to about 800 ppm, about 10 ppm to about 600 ppm, about 10 ppm to about 400 ppm, about 10 ppm to about 200 ppm, about 10 ppm to about 100 ppm, about 10 ppm to about 80 ppm, about 10 ppm to about 60 ppm, about 10 ppm to about 40 ppm, about 20 ppm to about 1000 ppm of the surfactant, about 20 ppm to about 800 ppm, about 20 ppm to about 600 ppm, about 20 ppm to about 400 ppm, about 20 ppm to about 200 ppm, about 20 ppm to about 100 ppm, about 20 ppm to about 80 ppm, about 20 ppm to about 60 ppm, or about 20 ppm to about 40 ppm.

The chemical-mechanical polishing composition can comprise one or more compounds capable of adjusting (i.e., that adjust) the pH of the polishing composition (i.e., pH adjusting compounds). The pH of the polishing composition can be adjusted using any suitable compound capable of adjusting the pH of the polishing composition. The pH adjusting compound desirably is water-soluble and compatible with the other components of the polishing composition. Typically, the chemical-mechanical polishing composition has a pH of about 1 to about 7 at the point-of-use (e.g., a pH of about 1 to about 6, of about 1 to about 5, of about 2 to about 7, of about 2 to about 6, of about 2 to about 5, of about 3 to about 6, or of about 1 to about 4). Preferably, the chemical-mechanical polishing composition has a pH of about 1 to about 4 at the point-of-use.

The compound capable of adjusting and buffering the pH can be selected from the group consisting of ammonium salts, alkali metal salts, carboxylic acids, alkali metal hydroxides, alkali metal carbonates, alkali metal bicarbonates, borates, and mixtures thereof.

The chemical-mechanical polishing composition optionally further comprises one or more additives. Illustrative additives include conditioners, acids (e.g., sulfonic acids), complexing agents, chelating agents, biocides, scale inhibitors, and dispersants.

A biocide, when present, can be any suitable biocide and can be present in the polishing composition in any suitable amount. A suitable biocide is an isothiazolinone biocide. Typically, the polishing composition comprises about 1 ppm to about 50 ppm biocide, preferably about 10 ppm to about 20 ppm biocide.

The polishing composition can be produced by any suitable technique, many of which are known to those skilled in the art. The polishing composition can be prepared in a batch or continuous process. Generally, the polishing composition is prepared by combining the components of the polishing composition. The term "component" as used herein includes individual ingredients (e.g., silica abrasive, surfactant, iron cation, optional ligand, optional pH adjustor, and/or any optional additive) as well as any combination of ingredients (e.g., silica abrasive, surfactant, iron cation, optional ligand, optional pH adjustor, and/or any optional additive, etc.).

For example, the polishing composition can be prepared by (i) providing all or a portion of the liquid carrier, (ii) dispersing the silica abrasive, surfactant, iron cation, optional ligand, optional pH adjustor, and/or any optional additive, using any suitable means for preparing such a dispersion, (iii) adjusting the pH of the dispersion as appropriate, and (iv) optionally adding suitable amounts of any other optional components and/or additives to the mixture.

Alternatively, the polishing composition can be prepared by (i) providing one or more components (e.g., surfactant, iron cation, optional ligand, optional pH adjustor, and/or any optional additive) in a silica abrasive slurry, (ii) providing one or more components in an additive solution (e.g., liquid carrier, surfactant, iron cation, optional ligand, optional pH adjustor, and/or any optional additive), (iii) combining the silica abrasive slurry and the additive solution to form a mixture, (iv) optionally adding suitable amounts of any other optional additives to the mixture, and (v) adjusting the pH of the mixture as appropriate.

The polishing composition can be supplied as a one-package system comprising a silica abrasive, surfactant, iron cation, optional ligand, optional pH adjustor, and/or any optional additive, and water. Alternatively, the polishing composition of the invention can be supplied as a two-package system comprising a silica abrasive slurry in a first package and an additive solution in a second package, wherein the silica abrasive slurry consists essentially of, or consists of, a silica abrasive, and water, and wherein the additive solution consists essentially of, or consists of, surfactant, iron cation, optional ligand, optional pH adjustor, and/or any optional additive. The two-package system allows for the adjustment of polishing composition characteristics by changing the blending ratio of the two packages, i.e., the silica abrasive slurry and the additive solution.

Various methods can be employed to utilize such a two-package polishing system. For example, the silica abrasive slurry and additive solution can be delivered to the polishing table by different pipes that are joined and connected at the outlet of supply piping. The silica abrasive slurry and additive solution can be mixed shortly or immediately before polishing, or can be supplied simultaneously on the polishing table. Furthermore, when mixing the two packages, deionized water can be added, as desired, to adjust the polishing composition and resulting substrate polishing characteristics.

Similarly, a three-, four-, or more package system can be utilized in connection with the invention, wherein each of multiple containers contains different components of the inventive chemical-mechanical polishing composition, one or more optional components, and/or one or more of the same components in different concentrations.

In order to mix components contained in two or more storage devices to produce the polishing composition at or near the point-of-use, the storage devices typically are provided with one or more flow lines leading from each storage device to the point-of-use of the polishing composition (e.g., the platen, the polishing pad, or the substrate surface). As utilized herein, the term "point-of-use" refers to the point at which the polishing composition is applied to the substrate surface (e.g., the polishing pad or the substrate surface itself). By the term "flow line" is meant a path of flow from an individual storage container to the point-of-use of the component stored therein. The flow lines can each lead directly to the point-of-use, or two or more of the flow lines can be combined at any point into a single flow line that leads to the point-of-use. Furthermore, any of the flow lines (e.g., the individual flow lines or a combined flow line) can first lead to one or more other devices (e.g., pumping device, measuring device, mixing device, etc.) prior to reaching the point-of-use of the component(s).

The components of the polishing composition can be delivered to the point-of-use independently (e.g., the components are delivered to the substrate surface whereupon the components are mixed during the polishing process), or one or more of the components can be combined before delivery to the point-of-use, e.g., shortly or immediately before delivery to the point-of-use. Components are combined "immediately before delivery to the point-of-use" if the components are combined about 5 minutes or less prior to being added in mixed form onto the platen, for example, about 4 minutes or less, about 3 minutes or less, about 2 minutes or less, about 1 minute or less, about 45 seconds or less, about 30 seconds or less, about 10 seconds or less prior to being added in mixed form onto the platen, or simultaneously to the delivery of the components at the point-of-use (e.g., the components are combined at a dispenser). Components also are combined "immediately before delivery to the point-of-use" if the components are combined within 5 m of the point-of-use, such as within 1 m of the point-of-use or even within 10 cm of the point-of-use (e.g., within 1 cm of the point-of-use).

When two or more of the components of the polishing composition are combined prior to reaching the point-of-use, the components can be combined in the flow line and delivered to the point-of-use without the use of a mixing device. Alternatively, one or more of the flow lines can lead into a mixing device to facilitate the combination of two or more of the components. Any suitable mixing device can be used. For example, the mixing device can be a nozzle or jet (e.g., a high pressure nozzle or jet) through which two or more of the components flow. Alternatively, the mixing device can be a container-type mixing device comprising one or more inlets by which two or more components of the polishing slurry are introduced to the mixer, and at least one outlet through which the mixed components exit the mixer to be delivered to the point-of-use, either directly or via other elements of the apparatus (e.g., via one or more flow lines). Furthermore, the mixing device can comprise more than one chamber, each chamber having at least one inlet and at least one outlet, wherein two or more components are combined in each chamber. If a container-type mixing device is used, the mixing device preferably comprises a mixing mechanism to further facilitate the combination of the components. Mixing mechanisms are generally known in the art and include stirrers, blenders, agitators, paddled baffles, gas sparger systems, vibrators, etc.

The polishing composition also can be provided as a concentrate which is intended to be diluted with an appropriate amount of water prior to use. In such an embodiment, the polishing composition concentrate comprises the components of the polishing composition in amounts such that, upon dilution of the concentrate with an appropriate amount of water, each component of the polishing composition will be present in the polishing composition in an amount within the appropriate range recited above for each component. For example, the silica abrasive, surfactant, iron cation, optional ligand, optional pH adjustor, and/or any optional additive can each be present in the concentrate in an amount that is about 2 times (e.g., about 3 times, about 4 times, or about 5 times) greater than the concentration recited above for each component so that, when the concentrate is diluted with an equal volume of water (e.g., 2 equal volumes water, 3 equal volumes of water, or 4 equal volumes of water, respectively), each component will be present in the polishing composition in an amount within the ranges set forth above for each component. Furthermore, as will be understood by those of ordinary skill in the art, the concentrate can contain an appropriate fraction of the water present in the final polishing composition in order to ensure that the silica abrasive, surfactant, iron cation, optional ligand, optional pH adjustor, and/or any optional additive are at least partially or fully dissolved in the concentrate.

The invention further provides a method of chemically-mechanically polishing a substrate comprising: (i) providing a substrate, (ii) providing a polishing pad, (iii) providing a chemical-mechanical polishing composition comprising: (a) a silica abrasive; (b) a surfactant; (c) an iron cation; (d) optionally a ligand; and (e) water, wherein the silica abrasive has a negative zeta potential in the chemical-mechanical polishing composition, (iv) contacting the substrate with the polishing pad and the chemical-mechanical polishing composition, and (v) moving the polishing pad and the chemical-mechanical polishing composition relative to the substrate to abrade at least a portion of the substrate to polish the substrate.

The chemical-mechanical polishing composition can be used to polish any suitable substrate and is especially useful for polishing substrates comprising at least one layer (typically a surface layer) comprised of a low dielectric material. Suitable substrates include wafers used in the semiconductor industry. The wafers typically comprise or consist of, for example, a metal, metal oxide, metal nitride, metal composite, metal alloy, a low dielectric material, or combinations thereof. The method of the invention is particularly useful for polishing substrates comprising carbon-based films (e.g., carbon hard-mask materials). In some embodiments, the substrate comprises a carbon-based film, wherein at least a portion of the carbon-based film is abraded at a removal rate (Å/min) to polish the substrate.

In certain embodiments, the substrate comprises a carbon-based film. The carbon based-film can be any suitable material (e.g., low dielectric material) containing carbon, many of which are known in the art. In some embodiments, the carbon based film comprises more than about 50 wt. % carbon, for example, more than about 60 wt. % carbon, more than about 70 wt. % carbon, more than about 80 wt. % carbon, more than about 90 wt. % carbon, or more than about 95 wt. % carbon. The carbon based-film can have any suitable phase. For example, the carbon-based film can be amorphous, crystalline, or a combination thereof. In certain embodiments, the carbon-based film is amorphous. Exemplary carbon-based films are described in Weigand, et al. ("Evaluating spin-on carbon materials at low temperatures for high wiggling resistance." *Advanced Etch Technology for Nanopatterning II*. Vol. 8685. International Society for Optics and Photonics, 2013) and Kim et al. ("Study on the etching characteristics of amorphous carbon layer in oxygen plasma with carbonyl sulfide." *Journal of Vacuum Science & Technology A: Vacuum, Surfaces, and Films*, (2013), 31.2: 021301, pp. 1-7).

In some embodiments, the substrate comprises a carbon-based film and at least a portion of the carbon-based film is abraded at a removal rate (Å/min) to polish the substrate. The chemical-mechanical polishing composition of the invention desirably exhibits a high removal rate when polishing a substrate comprising a carbon-based film according to a method of the invention. For example, when polishing substrates comprising a carbon-based film in accordance with an embodiment of the invention, the polishing composition desirably exhibits a removal rate of the carbon-based film of about 400 Å/min or higher, for example, about 500 Å/min or higher, about 600 Å/min or higher, about 700 Å/min or higher, about 800 Å/min or higher, about 900 Å/min or higher, about 1,000 Å/min or higher, about 1,100 Å/min or higher, about 1,200 Å/min or higher, about 1,500 Å/min or higher, about 2,000 Å/min or higher, about 3,000 Å/min or higher, or about 4,000 Å/min or higher.

In some embodiments, the substrate further comprises silicon oxide, silicon nitride, polysilicon, titanium nitride, or a combination thereof, and at least a portion of the silicon oxide, silicon nitride, polysilicon, or titanium nitride is abraded at a removal rate (Å/min) to polish the substrate. In embodiments where the substrate further comprises silicon oxide, silicon nitride, polysilicon, titanium nitride, or a combination thereof, the removal rate (Å/min) of the carbon-based film is greater than the removal rate (Å/min) of the silicon oxide, silicon nitride, polysilicon, or titanium nitride. For example, the removal rate (Å/min) of the carbon-based film can be at least 10 times greater than the removal rate (Å/min) of the silicon oxide, silicon nitride, polysilicon, or titanium nitride, at least 20 times greater than the removal rate (Å/min) of the silicon oxide, silicon nitride, polysilicon, or titanium nitride, or at least 40 times greater than the removal rate (Å/min) of the silicon oxide, silicon nitride, polysilicon, or titanium nitride.

In embodiments, where the substrate further comprises silicon oxide, the silicon oxide can be any suitable silicon oxide, many of which are known in the art. Suitable types of silicon oxide include but are not limited to borophosphosilicate glass (BPSG), tetraethyl orthosilicate (TEOS), plasma enhanced tetraethylorthosilicate (PETEOS), thermal oxide, undoped silicate glass, and high density plasma (HDP) oxide. The chemical-mechanical polishing composition of the invention desirably exhibits a low removal rate when polishing a substrate comprising silicon oxide according to a method of the invention. For example, when polishing substrates comprising silicon oxide in accordance with an embodiment of the invention, the polishing composition desirably exhibits a removal rate of silicon oxide of about 500 Å/min or lower, for example, about 250 Å/min or lower, about 200 Å/min or lower, about 150 Å/min or lower, about 100 Å/min or lower, about 50 Å/min or lower, about 25 Å/min or lower, about 10 Å/min or lower, or about 5 Å/min or lower. In some embodiments, the polishing composition exhibits a silicon oxide removal rate that is too low to be detected.

In embodiments, where the substrate further comprises polysilicon, the polysilicon can be any suitable polysilicon, many of which are known in the art. The polysilicon can have any suitable phase, and can be amorphous, crystalline, or a combination thereof. The chemical-mechanical polishing composition of the invention desirably exhibits a low removal rate when polishing a substrate comprising polysilicon according to a method of the invention. For example, when polishing substrates comprising polysilicon in accordance with an embodiment of the invention, the polishing composition desirably exhibits a removal rate of polysilicon of about 500 Å/min or lower, for example, about 250 Å/min or lower, about 200 Å/min or lower, about 150 Å/min or lower, about 100 Å/min or lower, about 50 Å/min or lower, about 25 Å/min or lower, about 10 Å/min or lower, or about 5 Å/min or lower. In some embodiments, the polishing composition exhibits a polysilicon removal rate that is too low to be detected.

In embodiments, where the substrate further comprises silicon nitride, the silicon nitride can be any suitable silicon nitride, many of which are known in the art. The chemical-mechanical polishing composition of the invention desirably exhibits a low removal rate when polishing a substrate comprising silicon nitride according to a method of the invention. For example, when polishing substrates comprising silicon nitride in accordance with an embodiment of the invention, the polishing composition desirably exhibits a removal rate of silicon nitride of about 500 Å/min or lower, for example, about 250 Å/min or lower, about 200 Å/min or lower, about 150 Å/min or lower, about 100 Å/min or lower, about 50 Å/min or lower, about 25 Å/min or lower, about 10 Å/min or lower, or about 5 Å/min or lower. In some embodiments, the polishing composition exhibits a silicon nitride removal rate that is too low to be detected.

In embodiments, where the substrate further comprises titanium nitride, the titanium nitride can be any suitable titanium nitride, many of which are known in the art. The chemical-mechanical polishing composition of the invention desirably exhibits a low removal rate when polishing a substrate comprising titanium nitride according to a method of the invention. For example, when polishing substrates comprising titanium nitride in accordance with an embodiment of the invention, the polishing composition desirably exhibits a removal rate of titanium nitride of about 500 Å/min or lower, for example, about 250 Å/min or lower, about 200 Å/min or lower, about 150 Å/min or lower, about 100 Å/min or lower, about 50 Å/min or lower, about 25 Å/min or lower, about 10 Å/min or lower, or about 5 Å/min or lower. In some embodiments, the polishing composition exhibits a titanium nitride removal rate that is too low to be detected.

The polishing composition of the invention desirably exhibits low particle defects when polishing a substrate, as determined by suitable techniques. Particle defects on a substrate polished with the inventive polishing composition can be determined by any suitable technique. For example, laser light scattering techniques, such as dark field normal beam composite (DCN) and dark field oblique beam composite (DCO), can be used to determine particle defects on polished substrates. Suitable instrumentation for evaluating particle defectivity is available from, for example, KLA-Tencor (e.g., SURFSCAN™ SPI instruments operating at a 120 nm threshold or at 160 nm threshold).

The chemical-mechanical polishing composition and method of the invention are particularly suited for use in conjunction with a chemical-mechanical polishing apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving the substrate relative to the surface of the polishing pad. The polishing of the substrate takes place by the substrate being placed in contact with the polishing pad and the polishing composition of the invention, and then the polishing pad moving relative to the substrate, so as to abrade at least a portion of the substrate to polish the substrate.

A substrate can be polished with the chemical-mechanical polishing composition using any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof. Soft polyurethane polishing pads are particularly useful in conjunction with the inventive polishing method. Typical pads include but are not limited to SURFIN™ 000, SURFIN™ SSW1, SPM3100 (commercially available from, for example, Eminess Technologies), POLITEX™, EPIC™ D100 pad (commercially available from Cabot Microelectronics), IC1010 pad (commercially available from Dow, Inc.) and Fujibo POLYPAS™ 27.

Desirably, the chemical-mechanical polishing apparatus further comprises an in situ polishing endpoint detection system, many of which are known in the art. Techniques for inspecting and monitoring the polishing process by analyzing light or other radiation reflected from a surface of the substrate being polished are known in the art. Such methods are described, for example, in U.S. Pat. Nos. 5,196,353, 5,433,651, 5,609,511. 5,643,046, 5,658,183, 5,730,642, 5,838,447, 5,872,633. 5,893,796, 5,949,927, and 5,964,643. Desirably, the inspection or monitoring of the progress of the polishing process with respect to a substrate being polished enables the determination of the polishing end-point, i.e., the determination of when to terminate the polishing process with respect to a particular substrate.

Aspects, including embodiments, of the invention described herein may be beneficial alone or in combination, with one or more other aspects or embodiments. Without limiting the foregoing description, certain non-limiting embodiments of the disclosure numbered 1-46 are provided below. As will be apparent to those of skill in the art upon reading this disclosure, each of the individually numbered embodiments may be used or combined with any of the preceding or following individually numbered embodiments. This is intended to provide support for all such combinations of embodiments and is not limited to combinations of embodiments explicitly provided below:

Embodiments (1) In embodiment (1) is presented a chemical-mechanical polishing composition comprising:
(a) a silica abrasive;
(b) a surfactant;
(c) an iron cation;
(d) optionally a ligand; and
(e) water,
wherein the silica abrasive has a negative zeta potential in the chemical-mechanical polishing composition.

(2) In embodiment (2) is presented the polishing composition of embodiment 1, wherein the polishing composition comprises about 0.001 wt. % to about 10 wt. % of the silica abrasive.

(3) In embodiment (3) is presented the polishing composition of embodiment 1 or embodiment 2, wherein the polishing composition comprises about 0.05 wt. % to about 5 wt. % of the silica abrasive.

(4) In embodiment (4) is presented the polishing composition of any one of embodiments (1)-(3), wherein the silica abrasive is colloidal silica.

(5) In embodiment (5) is presented the polishing composition of any one of embodiments (1)-(4), wherein the polishing composition has a pH of about 1 to about 7.

(6) In embodiment (6) is presented the polishing composition of any one of embodiments (1)-(5), wherein the polishing composition has a pH of about 1 to about 4.

(7) In embodiment (7) is presented the polishing composition of any one of embodiments (1)-(6), wherein the surfactant is a cationic surfactant.

(8) In embodiment (8) is presented the polishing composition of embodiment (7), wherein the cationic surfactant comprises a quaternary ammonium salt.

(9) In embodiment (9) is presented the polishing composition of embodiment (7), wherein the cationic surfactant is selected from N,N,N',N',N'-pentamethyl-N-tallow alkyl-1,3-propanediammonium dichloride, (oxydi-2,1-ethanediyl)bis (coco alkyl)dimethyl ammonium dichlorides, 3-methacrylamidopropyl-trimethyl-ammonium chloride ("MAPTAC"), 3-acrylamidopropyl-trimethyl-ammonium chloride ("APTAC"), diallyldimethylammonium chloride ("DADMAC"), 2-(acryloyloxy)-N,N,N-trimethylethanaminium chloride ("DMAEA.MCQ"), 2-(methacryloyloxy)-N,N,N-trimethylethanaminium chloride ("DMAEM.MCQ"), N,N-dimethylaminoethyl acrylate benzyl chloride ("DMAEA.BCQ"), N,N-dimethylaminoethyl methacrylate benzyl chloride ("DMAEM.BCQ"), and combinations thereof.

(10) In embodiment (10) is presented the polishing composition of any one of embodiments (1)-(6), wherein the surfactant is an anionic surfactant.

(11) In embodiment (11) is presented the polishing composition of embodiment (10), wherein the anionic surfactant is selected from an alkylsufonic acid, an alkylsulfonate, an arylsulfonic acid, an arylsulfonate, an alkylarylsulfonic acid, an alkylarylsulfonate, and combinations thereof.

(12) In embodiment (12) is presented the polishing composition of embodiment (10), wherein the anionic surfactant is selected from saturated or unsaturated $C_6$-$C_{40}$ alkyl sulfonate, saturated or unsaturated $C_6$-$C_{40}$ alkyl sulfonic acid, saturated or unsaturated $C_6$-$C_{40}$ alkyl benzene sulfonate, saturated or unsaturated $C_6$-$C_{40}$ alkyl benzene sulfonic acid, and combinations thereof.

(13) In embodiment (13) is presented the polishing composition of any one of embodiments (1)-(12), wherein the iron cation is present in the polishing composition in an amount of about 1 ppm to about 100 ppm.

(14) In embodiment (14) is presented the polishing composition of any one of embodiments (1)-(13), wherein the iron cation is present in the polishing composition in an amount of about 10 ppm to about 80 ppm.

(15) In embodiment (15) is presented the polishing composition of any one of embodiments (1)-(14), wherein the polishing composition comprises a ligand.

(16) In embodiment (16) is presented the polishing composition of embodiment (15), wherein the ligand comprises an alkene moiety, an alkyne moiety, a diacid moiety, an alcohol moiety, or a combination thereof.

(17) In embodiment (17) is presented the polishing composition of embodiment (15) or embodiment (16), wherein the ligand comprises an alkene moiety and a diacid moiety.

(18) In embodiment (18) is presented the polishing composition of embodiment (15) or embodiment (16), wherein the ligand comprises an alkyne moiety.

(19) In embodiment (19) is presented the polishing composition of embodiment (18), wherein the ligand further comprises an alcohol moiety.

(20) In embodiment (20) is presented the polishing composition of embodiment (15) or embodiment (16), wherein the ligand is selected from succinic acid, maleic acid, malonic acid, fumaric acid, phthalic acid, isophthalic acid, terephthalic acid, oxalic acid, tartaric acid, 3,5-dimethyl-1-hexyn-3-ol, 2,4,7,9-tetramethyl-5-decyne-4,7-diol, 2,4,7,9-tetramethyl-5-decyne-4,7-diol ethoxylate, 2,5-dimethyl-3-hexyne-2,5-diol, 3-methyl-1-pentyn-3-ol, and combinations thereof.

(21) In embodiment (21) is presented the polishing composition of any one of embodiments (1)-(20), wherein the silica abrasive has a zeta potential of −10 mV or less in the chemical-mechanical polishing composition.

(22) In embodiment (22) is presented the polishing composition of any one of embodiments (1)-(21), wherein the silica abrasive has a zeta potential of −20 mV or less in the chemical-mechanical polishing composition.

(23) In embodiment (23) is presented the polishing composition of any one of embodiments (1)-(22), wherein the silica abrasive has a zeta potential of −30 mV or less in the chemical-mechanical polishing composition.

(24) In embodiment (24) is presented a method of chemically-mechanically polishing a substrate comprising:

(i) providing a substrate,
(ii) providing a polishing pad,
(iii) providing a chemical-mechanical polishing composition comprising:
(a) a silica abrasive;
(b) a surfactant;
(c) an iron cation;
(d) optionally a ligand; and
(e) water,
wherein the silica abrasive has a negative zeta potential in the chemical-mechanical polishing composition,
(iv) contacting the substrate with the polishing pad and the chemical-mechanical polishing composition, and
(v) moving the polishing pad and the chemical-mechanical polishing composition relative to the substrate to abrade at least a portion of the substrate to polish the substrate.

(25) In embodiment (25) is presented the method of embodiment (24), wherein the polishing composition comprises about 0.001 wt. % to about 10 wt. % of the silica abrasive.

(26) In embodiment (26) is presented the method of embodiment (24) or embodiment (25), wherein the polishing composition comprises about 0.05 wt. % to about 5 wt. % of the silica abrasive.

(27) In embodiment (27) is presented the method of any one of embodiments (24)-(26), wherein the silica abrasive is colloidal silica.

(28) In embodiment (28) is presented the method of any one of embodiments (24)-(27), wherein the polishing composition has a pH of about 1 to about 7.

(29) In embodiment (29) is presented the method of any one of embodiments (24)-(28), wherein the polishing composition has a pH of about 1 to about 4.

(30) In embodiment (30) is presented the method of any one of embodiments (24)-(29), wherein the surfactant is a cationic surfactant.

(31) In embodiment (31) is presented the method of embodiment (30), wherein the cationic surfactant comprises a quaternary ammonium salt.

(32) In embodiment (32) is presented the method of embodiment (30), wherein the cationic surfactant is selected from N,N,N',N',N'-pentamethyl-N-tallow alkyl-1,3-propanediammonium dichloride, (oxydi-2,1-ethanediyl)bis(coco alkyl)dimethyl ammonium dichlorides, 3-methacrylamidopropyl-trimethyl-ammonium chloride ("MAPTAC"), 3-acrylamidopropyl-trimethyl-ammonium chloride ("APTAC"), diallyldimethylammonium chloride ("DADMAC"), 2-(acryloyloxy)-N,N,N-trimethylethanaminium chloride ("DMAEA.MCQ"), 2-(methacryloyloxy)-N,N,N-trimethylethanaminium chloride ("DMAEM.MCQ"), N,N-dimethylaminoethyl acrylate benzyl chloride ("DMAEA.BCQ"), N,N-dimethylaminoethyl methacrylate benzyl chloride ("DMAEM.BCQ"), and combinations thereof.

(33) In embodiment (33) is presented the method of any one of embodiments (24)-(29), wherein the surfactant is an anionic surfactant.

(34) In embodiment (34) is presented the method of embodiment (33), wherein the anionic surfactant is selected from an alkylsufonic acid, an alkylsulfonate, an arylsulfonic acid, an arylsulfonate, an alkylarylsulfonic acid, an alkylarylsulfonate, and combinations thereof.

(35) In embodiment (35) is presented the method of embodiment (33), wherein the anionic surfactant is selected from saturated or unsaturated $C_6$-$C_{40}$ alkyl sulfonate, saturated or unsaturated $C_6$-$C_{40}$ alkyl sulfonic acid, saturated or unsaturated $C_6$-$C_{40}$ alkyl benzene sulfonate, saturated or unsaturated $C_6$-$C_{40}$ alkyl benzene sulfonic acid, and combinations thereof.

(36) In embodiment (36) is presented the method of any one of embodiments (24)-(35), wherein the iron cation is present in the polishing composition in an amount of about 1 ppm to about 100 ppm.

(37) In embodiment (37) is presented the method of any one of embodiments (24)-(36), wherein the iron cation is present in the polishing composition in an amount of about 10 ppm to about 80 ppm.

(38) In embodiment (38) is presented the method of any one of embodiments (24)-(37), wherein the polishing composition comprises a ligand.

(39) In embodiment (39) is presented the method of embodiment (38), wherein the ligand comprises an alkene moiety, an alkyne moiety, a diacid moiety, an alcohol moiety, or a combination thereof.

(40) In embodiment (40) is presented the method of embodiment (38) or embodiment (39), wherein the ligand comprises an alkene moiety and a diacid moiety.

(41) In embodiment (41) is presented the method of embodiment (38) or embodiment (39), wherein the ligand comprises an alkyne moiety.

(42) In embodiment (42) is presented the method of embodiment (41), wherein the ligand further comprises an alcohol moiety.

(43) In embodiment (43) is presented the method of any one of embodiment (38) or embodiment (39), wherein the ligand is selected from succinic acid, maleic acid, malonic acid, fumaric acid, phthalic acid, isophthalic acid, terephthalic acid, oxalic acid, tartaric acid, 3,5-dimethyl-1-hexyn-3-ol, 2,4,7,9-tetramethyl-5-decyne-4,7-diol, 2,4,7,9-tetramethyl-5-decyne-4,7-diol ethoxylate, 2,5-dimethyl-3-hexyne-2,5-diol, 3-methyl-1-pentyn-3-ol, and combinations thereof.

(44) In embodiment (44) is presented the polishing composition of any one of embodiments (24)-(43), wherein the silica abrasive has a zeta potential of −10 mV or less in the chemical-mechanical polishing composition.

(45) In embodiment (45) is presented the polishing composition of any one of embodiments (24)-(44), wherein the silica abrasive has a zeta potential of −20 mV or less in the chemical-mechanical polishing composition.

(46) In embodiment (46) is presented the polishing composition of any one of embodiments (24)-(45), wherein the silica abrasive has a zeta potential of −30 mV or less in the chemical-mechanical polishing composition.

(47) In embodiment (47) is presented the method of any one of embodiments (24)-(46), wherein the substrate comprises a carbon-based film, and wherein at least a portion of the carbon-based film is abraded at a removal rate (Å/min) to polish the substrate.

(48) In embodiment (48) is presented the method of embodiment (47), wherein the substrate further comprises silicon oxide, silicon nitride, polysilicon, titanium nitride, or a combination thereof, and wherein at least a portion of the silicon oxide, silicon nitride, polysilicon, or titanium nitride is abraded at a removal rate (Å/min) to polish the substrate.

(49) In embodiment (49) is presented the method of embodiment (48), wherein the removal rate (Å/min) of the carbon-based film is greater than the removal rate (Å/min) of the silicon oxide, silicon nitride, polysilicon, or titanium nitride.

(50) In embodiment (50) is presented the method of embodiment (49), wherein the removal rate (Å/min) of the carbon-based film is at least 10 times greater than the removal rate (Å/min) of the silicon oxide, silicon nitride, polysilicon, or titanium nitride.

(51) In embodiment (51) is presented the method of embodiment (50), wherein the removal rate (Å/min) of the carbon-based film is at least 20 times greater than the removal rate (Å/min) of the silicon oxide, silicon nitride, polysilicon, or titanium nitride.

(52) In embodiment (52) is presented the method of embodiment (51), wherein the removal rate (Å/min) of the carbon-based film is at least 40 times greater than the removal rate (Å/min) of the silicon oxide, silicon nitride, polysilicon, or titanium nitride.

EXAMPLES

These following examples further illustrate the invention but, of course, should not be construed as in any way limiting its scope.

The following abbreviations are used throughout the Examples: removal rate (RR); carbon film (CF); spin-on dielectric containing carbon (SOD); tetraethyl orthosilicate (TEOS); polysilicon (polySi); silicon nitride (SiN); and molecular weight (MW).

In the following examples, SOD, TEOS, polySi, or SiN were coated on silicon, and the resulting patterned substrates were polished using a Logitech 2 benchtop polishing machine at 2 PSI (13.7 kPa) downforce using a Fujibo pad conditioned with a product commercially identified as A82 (3M, St. Paul, MN). Logitech polishing parameters were as follows: head speed=93 rpm, platen speed=87 rpm, total flow rate=150 mL/min. Removal rates were calculated by measuring the film thickness, using spectroscopic elipsometry, and subtracting the final thickness from the initial thickness.

Example 1

This example demonstrates the preparation of polishing compositions comprising a silica abrasive, a surfactant, an iron cation, and optionally a ligand according to the invention. Inventive polishing compositions 1A-1F and comparative polishing compositions 1G and 1H were used in Examples 2-6, below, to demonstrate the efficiency of the claimed polishing methods.

For each of the inventive compositions used in Examples 2-6, silica particles having a positive native zeta potential (Particle A: spherical silica particle treated to be cationic across a broad pH range with a dynamic light scattering particle size of 150 nm) or a negative native zeta potential (Particle B: oblong silica particle treated to be anionic across a broad pH range with a dynamic light scattering particle size of 75-80 nm) were combined with an anionic surfactant or cationic surfactant. For the purposes of the inventive compositions used in Examples 2-6, the anionic surfactant was CALSOFT™ LPS-99 (dodecylbenzene sulfonic acid; commercially available from Pilot Chemical Corporation, West Chester, OH) or ZETASPERSE™ Z2300 (a mixture of ethoxylated $C_6$-$C_{12}$ alcohols (CAS 68439-45-2) and $C_{10}$-$C_{14}$ alkylaryl sulfonates; commercially available from Air Products, Allentown, PA), and the cationic surfactant was diallyldimethylammonium chloride ("DADMAC"). An iron cation (i.e., as an iron compound described herein), a ligand, and/or potassium nitrate ($KNO_3$) was added to each of the inventive polishing compositions in the amounts specified in Table 1, and the pH of each inventive polishing composition was adjusted to 2.5. The inventive Polishing Compositions A-F each had a resulting silica particle zeta potential of less than 0 mV, i.e., had a negative zeta potential.

Comparative Polishing Composition 1G differed from inventive Polishing Compositions A-F because comparative Polishing Composition 1G did not contain a surfactant or an iron cation and had a resulting silica particle zeta potential of greater than 0 mV, i.e., had a positive zeta potential. The silica particle used for comparative Polishing Composition) G was Particle C, an oblong silica particle treated to be cationic across a broad pH range with a dynamic light scattering particle size of 45-55 nm, having a positive native zeta potential.

Comparative Polishing Composition 1H was similar to inventive Polishing Composition 1A except that the iron cation was not included in comparative Polishing Composition 1H.

The resulting compositions are summarized in Table 1.

TABLE 1

| Polishing Compositions | | | | | | |
|---|---|---|---|---|---|---|
| Polishing Composition | Surfactant (ppm) | Ligand (ppm) | [Fe] (ppm) | $KNO_3$ (ppm) | Particle/wt. %/ Zeta Potential | pH |
| Polishing Composition 1A (Inventive) | CALSOFT ™ LPS-99 (3000) | malonic acid (405) | 11 | 1250 | A/0.1/−45 mV | 2.5 |
| Polishing Composition 1B (Inventive) | ZETASPERSE ™ Z2300 (3000) | malonic acid (405) | 11 | 1250 | A/0.1/−52 mV | 2.5 |
| Polishing Composition 1C (Inventive) | ZETASPERSE ™ Z2300 (3000) | maleic acid (452) | 3 | 1250 | A/0.1/−44 mV | 2.5 |
| Polishing Composition 1D (Inventive) | ZETASPERSE ™ Z2300 (3000) | fumaric acid (452) | 3 | 1250 | A/0.1/−40 mV | 2.5 |
| Polishing Composition 1E (Inventive) | ZETASPERSE ™ Z2300 (300) | SURFYNOL ™ 61 (167) | 3 | 1250 | A/0.1/−11 mV | 2.5 |
| Polishing Composition 1F (Inventive) | DADMAC (20) | — | 1.5 | — | B/0.1/−18 mV | 2.5 |
| Polishing Composition 1G (Comparative) | — | acetic acid (220) | — | — | C/2/26 mV | 4.8 |

TABLE 1-continued

Polishing Compositions

| Polishing Composition | Surfactant (ppm) | Ligand (ppm) | [Fe] (ppm) | $KNO_3$ (ppm) | Particle/wt. %/ Zeta Potential | pH |
|---|---|---|---|---|---|---|
| Polishing Composition 1H (Comparative) | CALSOFT ™ LPS-99 (3000) | malonic acid (405) | — | 1250 | A/0.1/−27 mV | 2.5 |

Example 2

This example demonstrates the beneficial polishing performance provided by a polishing composition prepared according to the invention.

Patterned substrates comprising SOD, TEOS, SiN, or polySi were polished under identical conditions with Polishing Compositions 1A-1G, as defined in Table 1 of Example 1. In this particular example, SOD patterned substrates were used as a surrogate for measuring the carbon removal rate of commercially available carbon film materials. Following polishing, the RR for SOD, TEOS, SiN, and polySi was determined, and the results are set forth in Table 2.

TABLE 2

Polishing Removal Rates

| Polishing Composition | SOD (Å/min) | TEOS (Å/min) | SiN (Å/min) | PolySi (Å/min) |
|---|---|---|---|---|
| Polishing Composition 1A (Inventive) | 6042 | 13 | −2 | 0 |
| Polishing Composition 1B (Inventive) | 2017 | 24 | 16 | 73 |
| Polishing Composition 1C (Inventive) | 6042 | 32 | 8 | 27 |
| Polishing Composition 1D (Inventive) | 6051 | 28 | 2 | 48 |
| Polishing Composition 1E (Inventive) | 6029 | 68 | 15 | 42 |
| Polishing Composition 1F (Inventive) | 6042 | 13 | 17 | 37 |
| Polishing Composition 1G (Comparative) | 6042 | 2521 | 7 | 525 |

As is apparent from Table 2, inventive Polishing Compositions 1A and 1C-1F provided SOD removal rates, which were consistent with the SOD removal rate of comparative Polishing Composition 1G. However, each of inventive Polishing Compositions 1A-1F was significantly more selective for polishing SOD than comparative Polishing Composition 1G, as evidenced by the high TEOS and polySi removal rates for comparative Polishing Composition 1G. Thus, Table 2 shows that polishing compositions having a silica abrasive having a negative zeta potential and an iron cation provided a high SOD RR and improved the selectivity for removal of carbon-based films over silicon-based films relative to polishing compositions without a silica abrasive having a negative zeta potential and an iron cation.

Example 3

This example demonstrates the effect of ligand and iron cation concentration on polishing performance provided by a polishing composition prepared according to the invention.

Patterned substrates comprising SOD were polished under identical conditions with Polishing Compositions 1B-1E, as defined in Table 1 of Example 1. In this particular example, SOD patterned substrates were used as a surrogate for measuring the carbon film removal rate of commercially available carbon film materials. Following polishing, the RR for SOD was determined, and the results are set forth in Table 3.

TABLE 3

Effect of Ligand on Carbon Removal Rates (Å/min)

| Polishing Composition | Ligand | [Fe] (ppm) | SOD (Å/min) |
|---|---|---|---|
| Polishing Composition 1B (Inventive) | malonic acid | 11 | 2017 |
| Polishing Composition 1C (Inventive) | maleic acid | 3 | 6042 |
| Polishing Composition 1D (Inventive) | fumaric acid | 3 | 6051 |
| Polishing Composition 1E (Inventive) | Surfynol 61 | 3 | 6029 |

As is apparent from Table 3, Polishing Compositions 1C-1E, which contained a ligand having an olefin or alkyne in combination with a diacid or an alcohol, produced higher SOD removal rates relative to Polishing Composition 1B, which contained a ligand having a diacid only, despite having a lower iron cation concentration than Polishing Composition 1B.

Thus, Table 3 shows that polishing compositions containing a ligand having an alkene moiety, an alkyne moiety, a diacid moiety, an alcohol moiety, or a combination thereof, and preferably an alkene moiety or alkyne moiety in combination with a diacid or an alcohol, may require less iron cation and can produce higher carbon removal rates, as evidenced by SOD removal rates.

Example 4

This example demonstrates the effect of ligand and iron cation concentration on polishing performance provided by a polishing composition prepared according to the invention.

Patterned substrates comprising a carbon film such as those described in Weigand, et al. ("Evaluating spin-on carbon materials at low temperatures for high wiggling resistance." *Advanced Etch Technology for Nanopatterning II*. Vol. 8685. International Society for Optics and Photonics, 2013) and Kim et al. ("Study on the etching characteristics of amorphous carbon layer in oxygen plasma with carbonyl sulfide." *Journal of Vacuum Science & Technology A: Vacuum, Surfaces, and Films*, (2013), 31.2:021301, pp. 1-7) are polished under identical conditions with Polishing Compositions 1B-1E, as defined in Table 1 of Example 1. Following polishing, the CF RR is determined, and the predicted results are set forth in Table 4 as an estimated percentage of the SOD removal rate values provided in Table 3.

TABLE 4

Effect of Ligand on Carbon Removal Rates (Å/min)

| Polishing Composition | Ligand | [Fe] (ppm) | CF (Å/min) |
| --- | --- | --- | --- |
| Polishing Composition 1B (Inventive) | malonic acid | 11 | ~20% |
| Polishing Composition 1C (Inventive) | maleic acid | 3 | ~20% |
| Polishing Composition 1D (Inventive) | fumaric acid | 3 | ~20% |
| Polishing Composition 1E (Inventive) | Surfynol 61 | 3 | ~50% |

As is apparent from the predicted results set forth in Table 4, it is believed that Polishing Compositions 1C-1E, which contain a ligand having an olefin or alkyne in combination with a diacid or an alcohol, will produce higher carbon removal rates relative to Polishing Composition 1B (as referenced to Table 3 of Example 3), which contains a ligand having a diacid only, despite having a lower iron cation concentration than Polishing Composition 1B.

As is also apparent from Table 4, it is believed that the CF RR produced by Polishing Compositions 1B-1E will be lower than the removal rate of SOD, which was used as a surrogate for measuring the carbon film removal rate of commercially available carbon film materials, as described in Examples 2 and 3. In addition, it is believed that Polishing Composition 1E will have the highest CF RR of Polishing Compositions 1B-1E.

Example 5

This example demonstrates the effect of iron cation concentration on polishing performance provided by a polishing composition prepared according to the invention.

Patterned substrates comprising SOD were polished under identical conditions with inventive Polishing Composition 1A or comparative Polishing Composition 1H, as defined in Table 1 of Example 1. In this particular example, SOD patterned substrates were used as a surrogate for measuring the carbon film removal rate of commercially available carbon film materials. Following polishing, the RR for SOD was determined, and the results are set forth in Table 5.

TABLE 5

Effect of Iron Cation Concentration on Carbon Removal Rates (Å/min)

| Polishing Composition | [Fe] (ppm) | SOD (Å/min) |
| --- | --- | --- |
| Polishing Composition 1A (Inventive) | 11 | 6071 |
| Polishing Composition 1H (Comparative) | — | 6089 |

As is apparent from Table 5, inventive Polishing Composition 1A containing an iron cation produced a SOD removal rate, which was consistent with the SOD removal rate produced by comparative Polishing Composition 1H. Without wishing to be bound by any particular theory, it is believed that polishing compositions containing a silica abrasive having a negative zeta potential are so efficient at removing SOD that SOD patterned substrates may not be a suitable surrogate for measuring the effect of iron cation concentration on polishing performance. In other words, while being suitable for determining the selectivity of the inventive composition for a carbon film over TEOS, SiN, and polySi, the SOD substrate may not be suitable for determining the maximum carbon film removal rate of the inventive polishing compositions.

As described further in Example 6, it is believed that when an iron cation is completely absent from the polishing composition the carbon film removal rate of commercially available carbon film materials may decrease significantly.

Example 6

This example demonstrates the effect of iron cation concentration on polishing performance provided by a polishing composition prepared according to the invention.

Patterned substrates comprising a carbon film such as those described in Weigand, et al. ("Evaluating spin-on carbon materials at low temperatures for high wiggling resistance." *Advanced Etch Technology for Nanopatterning II*. Vol. 8685. International Society for Optics and Photonics, 2013) and Kim et al. ("Study on the etching characteristics of amorphous carbon layer in oxygen plasma with carbonyl sulfide." *Journal of Vacuum Science & Technology A: Vacuum, Surfaces, and Films*, (2013), 31.2:021301, pp. 1-7) are polished under identical conditions with inventive Polishing Composition 1A or comparative Polishing Composition 1H, as defined in Table 1 of Example 1. Following polishing, the CF RR is determined, and the predicted results are set forth in Table 6 as an estimated percentage of the SOD removal rate values provided in Example 5.

TABLE 6

Effect of Iron Cation Concentration on Carbon Removal Rates (Å/min)

| Polishing Composition | [Fe] (ppm) | CF (Å/min) |
| --- | --- | --- |
| Polishing Composition 1A (Inventive) | 11 | ~20% |
| Polishing Composition 1H (Comparative) | — | ~5% |

As is apparent from the predicted results set forth in Table 6, it is believed that the iron cation plays a crucial role in maintaining a high CF RR. More particularly, it is believed that when the iron cation is removed from Polishing Composition 1A, the CF RR may decrease by as much as 15%.

It is believed that increasing iron cation concentration produces higher carbon film removal rates. However, it is also believed that higher iron cation concentration may be correlated with multiple defect issues when polishing commercially available carbon film materials. Thus, it is important to use the ideal iron cation concentration for maintaining high carbon film removal rates, high selectivity, and minimal defects. The invention described herein provides a means to maintain the high carbon film removal rates, while avoiding defect issues.

In this respect, Examples 3-6 show that an iron cation is a necessary component for achieving optimal carbon film removal rates, and the level of iron cation necessary to maintain these optimal carbon film removal rates can be reduced by the addition of a ligand having an alkene moiety, an alkyne moiety, a diacid moiety, an alcohol moiety, or a combination thereof, thereby avoiding defect issues when polishing carbon films.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical-mechanical polishing composition comprising:
   (a) about 0.001 wt. % to about 10 wt. % of a colloidal silica abrasive;
   (b) a surfactant, wherein the surfactant is an anionic surfactant, and wherein the anionic surfactant is selected from an alkylsufonic acid, an alkylsulfonate, an arylsulfonic acid, an arylsulfonate, an alkylarylsulfonic acid, an alkylarylsulfonate, and combinations thereof,
   (c) about 1 ppm to about 100 ppm of an iron cation;
   (d) a ligand; and
   (e) water,
   wherein the polishing composition has a pH of about 1 to about 7, and wherein the silica abrasive has a zeta potential of −10 mV or less in the chemical-mechanical polishing composition.

2. The polishing composition of claim 1, wherein the polishing composition comprises about 0.05 wt. % to about 5 wt. % of the silica abrasive.

3. The polishing composition of claim 1, wherein the polishing composition has a pH of about 1 to about 4.

4. The polishing composition of claim 1, wherein the anionic surfactant is selected from saturated or unsaturated $C_6$-$C_{40}$ alkyl sulfonate, saturated or unsaturated $C_6$-$C_{40}$ alkyl sulfonic acid, saturated or unsaturated $C_6$-$C_{40}$ alkyl benzene sulfonate, saturated or unsaturated $C_6$-$C_{40}$ alkyl benzene sulfonic acid, and combinations thereof.

5. The polishing composition of claim 1, wherein the iron cation is present in the polishing composition in an amount of about 10 ppm to about 80 ppm.

6. The polishing composition of claim 1, wherein the ligand comprises an alkene moiety, an alkyne moiety, a diacid moiety, an alcohol moiety, or a combination thereof.

7. The polishing composition of claim 6, wherein the ligand is selected from succinic acid, maleic acid, malonic acid, fumaric acid, phthalic acid, isophthalic acid, terephthalic acid, oxalic acid, tartaric acid, 3,5-dimethyl-1-hexyn-3-ol, 2,4,7,9-tetramethyl-5-decyne-4,7-diol, 2,4,7,9-tetramethyl-5-decyne-4,7-diol ethoxylate, 2,5-dimethyl-3-hexyne-2,5-diol, 3-methyl-1-pentyn-3-ol, and combinations thereof.

8. A chemical-mechanical polishing composition comprising:
   (a) about 0.001 wt. % to about 10 wt. % of a colloidal silica abrasive;
   (b) a surfactant wherein the surfactant is a cationic surfactant, wherein the cationic surfactant comprises a quaternary ammonium salt,
   (c) about 1 ppm to about 100 ppm of an iron cation; and
   (d) water, wherein the polishing composition has a pH of about 1 to about 7, and wherein the silica abrasive has a zeta potential of −10 mV or less in the chemical-mechanical polishing composition.

9. The polishing composition of claim 8, wherein the cationic surfactant is selected from N,N,N',N',N'-pentamethyl-N-tallow alkyl-1,3-propanediammonium dichloride, (oxydi-2,1-ethanediyebis(coco alkyl)dimethyl ammonium dichlorides, 3-methacrylamidopropyl-trimethyl-ammonium chloride ("MAPTAC"), 3-acrylamidopropyl-trimethyl-ammonium chloride ("APTAC"), diallyldimethylammonium chloride ("DADMAC"), 2-(acryloyloxy)-N,N,N-trimethylethanaminium chloride ("DMAEA.MCQ"), 2-(methacryloyloxy)-N,N,N-trimethylethanaminium chloride ("DMAEM.MCQ"), N,N-dimethylaminoethyl acrylate benzyl chloride ("DMAEA.BCQ"), N,N-dimethylaminoethyl methacrylate benzyl chloride ("DMAEM.BCQ"), and combinations thereof.

* * * * *